United States Patent
Zeng

(10) Patent No.: US 9,373,812 B2
(45) Date of Patent: Jun. 21, 2016

(54) WHITE OLED DISPLAY DEVICE AND PACKAGING METHOD THEREOF

(71) Applicant: Shenzhen China Star Optoelectronics Technology Co., Ltd., Shenzhen, Guangdong (CN)

(72) Inventor: Weijing Zeng, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 48 days.

(21) Appl. No.: 14/402,680

(22) PCT Filed: Oct. 17, 2014

(86) PCT No.: PCT/CN2014/088841
§ 371 (c)(1),
(2) Date: Nov. 20, 2014

(87) PCT Pub. No.: WO2016/054837
PCT Pub. Date: Apr. 14, 2016

(65) Prior Publication Data
US 2016/0104861 A1    Apr. 14, 2016

(30) Foreign Application Priority Data
Oct. 10, 2014    (CN) .......................... 2014 1 05317836

(51) Int. Cl.
*H01L 51/56* (2006.01)
*H01L 51/52* (2006.01)
(Continued)

(52) U.S. Cl.
CPC .......... *H01L 51/5246* (2013.01); *H01L 27/322* (2013.01); *H01L 27/3244* (2013.01); *H01L 51/005* (2013.01); *H01L 51/0034* (2013.01); *H01L 51/0081* (2013.01); *H01L 51/5253* (2013.01); *H01L 51/5259* (2013.01); *H01L 51/56* (2013.01); *H01L 2227/323* (2013.01); *H01L 2251/301* (2013.01); *H01L 2251/303* (2013.01)

(58) Field of Classification Search
CPC ..... H01L 51/56; H01L 51/52; H01L 51/5246; H01L 51/005; H01L 51/0081; H01L 51/5253; H01L 51/5259; H01L 27/322; H01L 27/3244
See application file for complete search history.

(56) References Cited

U.S. PATENT DOCUMENTS

| | | | | |
|---|---|---|---|---|
| 6,515,428 B1 * | 2/2003 | Yeh | ........................ | H01L 27/322 313/489 |
| 7,238,436 B2 * | 7/2007 | Hatwar | .................. | C09K 11/06 313/504 |
| 7,348,207 B2 * | 3/2008 | Kobayashi | ............ | H01L 27/322 257/103 |

(Continued)

*Primary Examiner* — Savitr Mulpuri
(74) *Attorney, Agent, or Firm* — Andrew C. Cheng

(57) ABSTRACT

The present invention provides a white OLED display device and a packaging method thereof. The white OLED display device includes: a glass cover plate, a color filter layer coated on the glass cover plate, a transparent protective layer covering the color filter layer, a hydrophobic layer self-assembled on the transparent protective layer, a desiccant layer disposed on the hydrophobic layer, and a TFT substrate disposed with a white OLED layer. The color filter layer, the transparent protective layer, the hydrophobic layer and the desiccant layer are sandwiched between the glass cover plate and the TFT substrate disposed with the white OLED layer. The white OLED display device provided by the invention disposes the hydrophobic layer on the transparent protective layer, which can avoid the occurrence of mura caused by uneven distribution of desiccant.

10 Claims, 1 Drawing Sheet

(51) Int. Cl.
*H01L 27/32* (2006.01)
*H01L 51/00* (2006.01)

(56) References Cited

U.S. PATENT DOCUMENTS

| | | | | |
|---|---|---|---|---|
| 8,120,241 B2* | 2/2012 | Lee | | B82Y 20/00 |
| | | | | 313/504 |
| 8,159,426 B2* | 4/2012 | Chang | | G09G 3/3208 |
| | | | | 313/463 |
| 8,907,871 B2* | 12/2014 | Orsley | | G06F 3/044 |
| | | | | 345/173 |
| 9,236,420 B2* | 1/2016 | Lee | | H01L 27/323 |
| 9,246,128 B2* | 1/2016 | Tsai | | H01L 51/5246 |
| 9,257,490 B2* | 2/2016 | Shieh | | H01L 27/322 |
| 2011/0073901 A1* | 3/2011 | Fujita | | C09D 165/00 |
| | | | | 257/100 |
| 2011/0105637 A1* | 5/2011 | Fujita | | C08L 23/22 |
| | | | | 522/120 |
| 2014/0246653 A1* | 9/2014 | Wu | | H01L 27/1222 |
| | | | | 257/40 |
| 2015/0340655 A1* | 11/2015 | Lee | | H01L 51/525 |
| | | | | 257/40 |

* cited by examiner

WHITE OLED DISPLAY DEVICE AND PACKAGING METHOD THEREOF

TECHNICAL FIELD

The present invention relates to the field of display technology, and particularly to a white OLED display device and a packaging method thereof.

DESCRIPTION OF RELATED ART

OLED, i.e., organic light-emitting diode, has the characteristics of self-emissive, high brightness, wide viewing angle, high contrast, flexible and low energy consumption, etc., and thus has been widely concerned. The OLED as a new generation of display has begun to gradually replace the traditional LCD (Liquid crystal display) and widely used for mobile phone screens, computer monitors and full-color televisions, etc.

The traditional organic full-color display device is with RGB three-color pixels formed on a TFT substrate, but a manufacturing method thereof has a high requirement for fine mask, and thus it is difficult to achieve a high resolution display device. Therefore, a structure of white light plus color filter is adopted in the prior art to replace the RGB three-color pixels structure. The structure of display with white light plus color filter has been published in related patents.

Currently-used packaging technologies are: ultraviolet (UV) curing sealant, glass powder laser sealing, face sealing, sealant and desiccant fill sealing (dam and fill), film sealing and so on. The packaging method of dam and fill is more suitable for use in large-sized panel package.

As to a top-emission panel structure, if the liquid desiccant is unevenly distributed, it may cause the occurrence of mura (Mura is a phenomenon of various kinds of marks caused by uneven display brightness). The reason is as follows: the spreadability of liquid at an interface is relevant to the nature of the interface. A polar liquid has a good spreadability (i.e., the contact angle is small) at a hydrophilic interface while has a poor spreadability (i.e., the contract angle is large) at a hydrophobic interface. On the contrary, a non-polar liquid has a poor spreadability at the hydrophilic interface while has a good spreadability at the hydrophobic interface. An untreated inorganic protective layer interface generally is a hydrophilic interface, but most of liquid desiccants are non-polar organics. Accordingly, in general, the desiccant has a poor spreadability on the CF (color filter) protective layer, and thus uneven distribution phenomenon of the desiccant during the production process easily occurs.

SUMMARY

Accordingly, embodiments of the present invention provides a white OLED display device and a packaging method thereof, so as to solve the technical problem of the occurrence of mura caused by uneven distribution of desiccant in the prior art.

In order to solve the above described technical problem, an embodiment of the present invention provides a white OLED display device. The display device includes: a glass cover plate, a color filter layer coated on the glass cover plate, a transparent protective layer covering the color filter layer, a hydrophobic layer self-assembled on the transparent protective layer, a desiccant layer disposed on the hydrophobic layer, and a TFT substrate formed with a white OLED layer. The color filter layer, the transparent protective layer, the hydrophobic layer and the desiccant layer are sandwiched between the glass cover plate and the TFT substrate formed with the white OLED layer.

According to a preferred embodiment of the present invention, the white OLED display device further includes a sealant. The sealant is disposed at the periphery of the color filter layer, the transparent protective layer, the desiccant layer, the hydrophobic layer and the white OLED layer and sandwiched between the glass cover plate and the TFT substrate for sealing and protecting internal coatings of the white OLED display device. The transparent protective layer is an Al2O3 layer, a WO3 layer, a ZnO layer or a ZnSe layer, which does not chemically react with the desiccant layer and is dense. An area of the transparent protective layer is larger than or equal to an area of the color filter layer to ensure the transparent protective layer completely covering the color filter.

According to a preferred embodiment of the present invention, the hydrophobic layer is an organic acid molecule containing alkyl chain, a chemical formula thereof is a fatty acid R—(CH2)nCOOH, where n≥1, R is a terminal group selected from the group consisting of methyl, vinyl and ethynyl.

According to a preferred embodiment of the present invention, the glass cover plate, the color filter layer, the transparent protective layer, the desiccant layer and the hydrophobic layer are vacuum bonded with the TFT substrate formed with the white OLED layer. A filling method for the desiccant layer is screen printing, drop coating or dispensing. The sealant is cured at the periphery of the color filter layer, the transparent protective layer, the desiccant layer, the hydrophobic layer and the white OLED layer by ultraviolet light radiation.

According to a preferred embodiment of the present invention, the color filter layer is formed by coating RGB photo resists on the glass cover plate. The desiccant layer is a curable liquid desiccant, and the desiccant layer is cured on the transparent protective layer by heating or ultraviolet light radiation. The curable liquid desiccant is an aluminium-containing polymer and a chemical formula thereof is [R—O—Al=O]n, where n≥1.

In order to solve the above technical problem, another embodiment of the present invention provides a packaging method of a white OLED display device. The packaging method includes the following steps: coating a color filter layer on a glass cover plate; coating a transparent protective layer on the color filter layer to cover the color filter layer; self-assembling a hydrophobic layer on the transparent protective layer; disposing a desiccant layer on the hydrophobic layer; disposing a white OLED layer on a TFT substrate; and bonding the TFT substrate disposed with the white OLED layer with the glass cover plate disposed with the color filter layer, the transparent protective layer, the hydrophobic layer and the desiccant layer in a vacuum environment to thereby form a white OLED display device.

According to a preferred embodiment of the present invention, the packaging method further includes: coating a sealant at the periphery of the color filter layer, the transparent protective layer, the desiccant layer and the hydrophobic layer and whereby the sealant is sandwiched between the glass cover plate and the TFT substrate for sealing and protecting internal coating of the white OLED display device. The transparent protective layer is an Al2O3 layer, a WO3, a ZnO layer or a ZnSe layer, which does not chemically react with the desiccant layer and is dense. An area of the transparent protective layer is larger than or equal to an area of the color filter layer to ensure the transparent protective layer completely covering the color filter layer.

According to a preferred embodiment of the present invention, the hydrophobic layer is an organic acid molecule containing alkyl chain, and a chemical formula thereof is a fatty acid R—$(CH2)nCOOH$, where $n\geq 1$, R is a terminal group selected from the group consisting of methyl, vinyl and ethynyl.

According to a preferred embodiment of the present invention, the glass cover plate, the color filter layer, the transparent protective layer, the desiccant layer and the hydrophobic layer are vacuum bonded with the TFT substrate disposed with the white OLED layer. A filling method for the desiccant layer is screen printing, drop coating or dispensing. The sealant is cured at the periphery of the color filter layer, the transparent protective layer, the desiccant layer, the hydrophobic layer and the white OLED layer by ultraviolet light radiation.

According to a preferred embodiment of the present invention, the color filter layer is formed by coating RGB photo resists on the glass cover plate. The desiccant layer is a curable liquid desiccant, and the desiccant layer is cured on the transparent protective layer by heating or ultraviolet light radiation. The curable liquid desiccant is an aluminium-containing polymer, and a chemical formula thereof is $[R—O—Al=O]n$, where $n\geq 1$.

Compared with the prior art, the white OLED display device and the manufacturing method thereof provided by the present invention dispose the hydrophobic layer on the transparent protective layer, which can avoid the occurrence of mura caused by uneven distribution of desiccant.

BRIEF DESCRIPTION OF THE DRAWINGS

In order to more clearly illustrate the technical solutions of various embodiments of the present invention, drawings will be used in the description of embodiments will be given a brief description below. Apparently, the drawings in the following description only are some embodiments of the invention, the ordinary skill in the art can obtain other drawings according to these illustrated drawings without creative effort. In the drawings.

DETAILED DESCRIPTION OF EMBODIMENTS

In the following, with reference to accompanying drawings of embodiments of the present invention, technical solutions in the embodiments of the present invention will be clearly and completely described. Apparently, the embodiments of the present invention described below only are a part of embodiments of the present invention, but not all embodiments. Based on the described embodiments of the present invention, all other embodiments obtained by ordinary skill in the art without creative effort belong to the scope of protection of the present invention.

Figure 1:
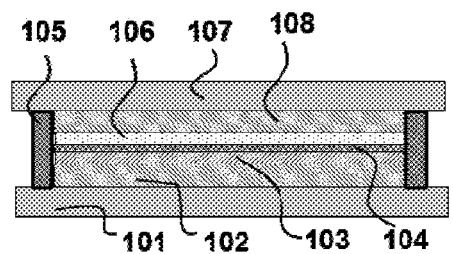
FIG. 1 is a schematic structural view of a preferred embodiment of a white OLED display device according to the present invention.

Referring to FIG. 1, FIG. 1 is a schematic structural view of a preferred embodiment of a white OLED display device according to the invention. The white OLED display device includes: a glass cover plate 101, a color filter (CF) layer 102, a transparent protective layer 103, a hydrophobic layer 104, a desiccant layer 106, a white OLED layer 108 and a TFT (thin film transistor) substrate 107.

Concretely speaking, the color filter layer 102 is coated on the glass cover plate 101. The color filter layer 102 is formed by coating RGB photo resists on the glass cover plate 101.

The transparent protective layer 103 covers the color filter layer 102. The transparent protective layer 103 is an $Al2O3$ (aluminium oxide) layer, a $WO3$ (tungsten trioxide) layer, a $ZnO$ (zinc oxide) layer or a $ZnSe$ (zinc selenide) layer, which does not chemically react with the desiccant layer and is dense. Of course, the transparent protective layer may be other inorganic coating, and it is not limited herein.

In addition, an area of the transparent protective layer 103 is larger than or equal to an area of the color filter layer 102 to ensure the transparent protective layer 103 completely covering the color filter layer 102 and provide the color filter layer 102 with complete protection.

The hydrophobic layer 104 is formed on the transparent protective layer 103 by self-assembly. The so-called self-assembly is a technique that makes basic structural units (such as molecules, nanomaterials, micro or even more large-sized substances) spontaneously form an ordered structure. In the self-assembling process, the basic structural units spontaneously organize or aggregate into a stable structure with certain regular geometric appearance based on non-covalent interactions.

The hydrophobic layer 104 may be an organic acid molecule containing an alkyl chain, e.g., a fatty acid, a chemical formula thereof is R—$(CH2)nCOOH$, where $n\geq 1$, R is a terminal group such as methyl, vinyl or ethynyl.

The desiccant layer 106 is disposed on the hydrophobic layer 104. A coating method for the desiccant layer 106 may be screen printing, drop coating, or dispensing, etc. The desiccant layer 106 may be a curable liquid desiccant, for example a thermosetting liquid desiccant, the desiccant layer is cured on the hydrophobic layer 104 by heating or ultraviolet (UV) light radiation. The curable liquid desiccant may be an aluminium-containing polymer, and a chemical formula thereof is $[R—O—Al=O]n$, where $n\geq 1$.

The white OLED layer 108 is disposed on the TFT substrate 107. The glass cover plate 101, the color filter layer 102, the transparent protective layer 103, the hydrophobic layer 104 and the desiccant layer 106 together are bonded with the TFT substrate 107 formed with the white OLED layer 108 in a vacuum environment, so as to ensure the display effect of the display device being not affected by gas existing among these layers.

Preferably, the white OLED display device further includes a sealant 105. The sealant 105 is disposed at the periphery of the color filter layer 102, the transparent protective layer 103, the hydrophobic layer 104 and the desiccant layer 106, i.e., outside an AA (active area) of the glass cover plate 101 and sandwiched between the glass cover plate 101 and the TFT substrate 107, so as to seal and protect internal coatings of the white OLED display device. The sealant 105 can be cured at the periphery of the color filter layer 102, the transparent protective layer 103, the hydrophobic layer 104 and the desiccant layer 106 by ultraviolet light radiation.

The white OLED display device provided by the embodiment of the invention disposes the hydrophobic layer on the transparent protective layer, which can avoid the occurrence of mura caused by uneven distribution of desiccant to affect the display effect of the display device.

Figure 2:
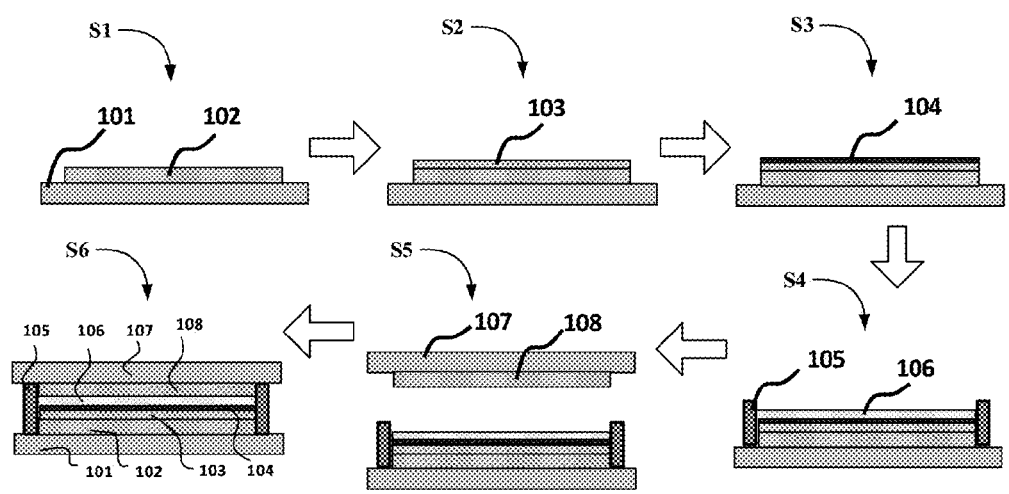
FIG. 2 is a flowchart of a packaging method of a white OLED display device according to the present invention.

Another embodiment of the invention provides a packaging method of white OLED display device. Referring to FIG. 2, FIG. 2 is a flowchart of the packaging method of a white OLED display device according to the invention. The packaging method includes but not limited to the following steps:

STEP 1, RGB photo resists are coated on a glass cover plate 101 to form a CF (color filter) layer 102. The CF layer 102 covers the AA (active area) of the display device.

STEP 2, a transparent protective layer 103 is formed on the CF layer 102. An area of the transparent protective layer 103 is larger than or equal to an area of the CF layer 102, so as to ensure the transparent protective layer 103 completely covering the color filter layer 102 and thereby provide the color filter layer 102 with complete protection.

The transparent protective layer 103 is an Al2O3 layer, a WO3 layer, a ZnO layer or a ZnSe layer, which does not chemically react with the desiccant layer 106 and is dense. Of course, the transparent protective layer 103 may be other inorganic coating, and it is not limited herein.

STEP 3, a hydrophobic layer 104 is formed on the transparent protective layer 103 by self-assembly. The so-called self-assembly is a technique that basic structural units (such as molecules, nanomaterials, micro or even more large-sized substance) spontaneously form an ordered structure. In the self-assembling process, the basic structural units spontaneously organize or aggregate into a stable structure with certain regular geometric appearance based on non-covalent interactions.

The hydrophobic layer 104 may be an organic acid molecule containing alkyl chain, e.g., a fatty acid with a chemical formula R—(CH2)nCOOH, where n≥1, R is a terminal group such as methyl, vinyl or ethynyl.

STEP 4, a sealant 105 is coated outside an AA (active area) of the glass cover plate 101, and a liquid desiccant 106 is filled inside the sealant 105 and on the hydrophobic layer 104.

A filling method of the desiccant layer 106 may be screen printing, drop coating, or dispensing, etc. The desiccant layer 106 may be a curable liquid desiccant, for example a thermosetting liquid desiccant, and the desiccant layer 106 is cured on the hydrophobic layer 104 by heating or ultraviolet (UV) light radiation. The curable liquid desiccant may be an aluminium-containing polymer, and a chemical formula thereof is [R—O—Al═O]n, where n≥1.

The sealant 105 is coated at the periphery of the color filter layer 102, the transparent protective layer 103, the hydrophobic layer 104 and the desiccant layer 106, i.e., outside the AA of the glass cover plate 101 and sandwiched between the glass cover plate 101 and the TFT substrate 107, so as to seal and protect internal coatings of the white OLED display device.

STEP 5, the glass cover plate 101 is bonded with the TFT substrate 107 formed with a white OLED layer 108 in a vacuum environment, so as to ensure the display effect of the display device being not affected by gas existing between the substrate and the plate.

STEP 6, the sealant 105 is cured. Specifically, the sealant 105 can be cured at the periphery of the color filter layer 102, the transparent protective layer 103, the hydrophobic layer 104 and the desiccant layer 106 by ultraviolet (UV) light radiation or heating via other heat source.

The packaging method of a white OLED display device provided by the embodiment of the invention disposes the hydrophobic layer on the transparent protective layer, which can avoid the occurrence of mura caused by uneven distribution of desiccant to affect the display effect of the display device. Moreover, the sealant is cured by UV, which can ensure the substrate and the plate being securely fasten together and having an excellent sealing therebetween.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A white OLED (organic light-emitting diode) display device comprising:
    a glass cover plate;
    a color filter layer coated on the glass cover plate;
    a transparent protective layer covering the color filter layer;
    a hydrophobic layer self-assembled on the transparent protective layer;
    a desiccant layer disposed on the hydrophobic layer; and
    a TFT substrate formed with a white OLED layer;
    wherein the color filter layer, the transparent protective layer, the hydrophobic layer and the desiccant layer are sandwiched between the glass cover plate and the TFT substrate formed with the white OLED layer;
    wherein the white OLED display device further comprises a sealant, the sealant is coated at the periphery of the color filter layer, the transparent protective layer, the desiccant layer, the hydrophobic layer and the white OLED layer and sandwiched between the glass cover plate and the TFT substrate to thereby seal and protect internal coatings of the white OLED display device; the transparent protective layer is a Al2O3 layer, a WO3 layer, a ZnO layer or a ZnSe layer, which does not chemically react with the desiccant layer and is dense, and an area of the transparent protective layer is larger than or equal to an area of the color filter layer to thereby ensure the transparent protective layer completely covering the color filter layer; the glass cover plate, the color filter layer, the transparent protective layer, the desiccant layer and the hydrophobic layer are vacuum bonded with the TFT substrate formed with the white OLED layer; a filling method for the desiccant layer is screen printing, drop coating or dispensing, wherein an area of the transparent protective layer is larger than or equal to an area of the color filter layer to thereby ensure the transparent protective layer completely covering the color filter layer, wherein the hydrophobic layer is an organic acid molecule containing alkyl chain, and a chemical formula is a fatty acid R—(CH2)nCOOH, where n>1, R is a terminal group selected from the group consisting of methyl, vinyl and ethynyl.

2. The white OLED display device according to claim 1, wherein the glass cover plate, the color filter layer, the transparent protective layer, the desiccant layer and the hydrophobic layer together are vacuum bonded to the TFT substrate formed with the white OLED layer.

3. The white OLED display device according to claim 1, wherein a filling method for the desiccant layer is screen printing, drop coating or dispensing.

4. The white OLED display device according to claim 1, wherein the sealant is cured at the periphery of the color filter layer, the transparent protective layer, the desiccant layer, the hydrophobic layer and the white OLED layer by ultraviolet light radiation.

5. The white OLED display device according to claim 1, wherein the color filter layer is formed by coating RGB photo resists on the glass cover plate; the desiccant layer is a curable liquid desiccant, the desiccant layer is cured on the transparent protective layer by heating or ultraviolet light radiation, and the curable liquid desiccant is an aluminium-containing polymer and a chemical formula thereof is [R—O—Al═O]n, where n≥1.

6. A packaging method of a white OLED display device, comprising the following steps:
- coating a color filter layer on a glass cover plate;
- coating a transparent protective layer on the color filter layer to cover the color filter layer;
- self-assembling a hydrophobic layer on the transparent protective layer, wherein the hydrophobic layer is an organic acid molecule containing alkyl chain, and a chemical formula is a fatty acid R—(CH2)nCOOH, where n>1, R is a terminal group selected from the group consisting of methyl, vinyl and ethynyl;
- disposing a desiccant layer on the hydrophobic layer;
- disposing a white OLED layer on a TFT substrate;
- vacuum bonding the TFT substrate disposed with the white OLED layer with the glass cover plate disposed with the color filter layer, the transparent protective layer, the hydrophobic layer and the desiccant layer, to thereby form a white OLED display device;
- coating a sealant at the periphery of the color filter layer, the transparent protective layer, the desiccant layer and the hydrophobic layer and whereby the sealant is sandwiched between the glass cover plate and the TFT substrate to seal and protect internal coatings of the white OLED display device, wherein an area of the transparent protective layer is larger than or equal to an area of the color filter layer to thereby ensure the transparent protective layer completely covering the color filter layer;
- wherein the transparent protective layer is an Al2O3 layer, a WO3 layer, a ZnO layer or a ZnSe layer, which does not chemically react with the desiccant layer and is dense.

7. The packaging method according to claim 6, wherein the glass cover plate, the color filter layer, the transparent protective layer, the desiccant layer and the hydrophobic layer are vacuum bonded with the TFT substrate disposed with the white OLED layer.

8. The packaging method according to claim 6, wherein a filling method for the desiccant layer is screen printing, drop coating or dispensing.

9. The packaging method according to claim 6, wherein the sealant is cured at the periphery of the color filter layer, the transparent protective layer, the desiccant layer, the hydrophobic layer and the white OLED layer by ultraviolet light radiation.

10. The packaging method according to claim 6, wherein the color filter layer is formed by coating RGB photo resists on the glass cover plate; the desiccant layer is a curable liquid desiccant, the desiccant layer is cured on the transparent protective layer by heating or ultraviolet light radiation, the curable liquid desiccant is an aluminium-containing polymer and a chemical formula thereof is [R—O—Al═O]n, where n≥1.

* * * * *